(12) United States Patent
Amou et al.

(10) Patent No.: US 8,115,105 B2
(45) Date of Patent: Feb. 14, 2012

(54) PREPREG AND ITS APPLICATION PRODUCTS FOR LOW THERMAL EXPANSION AND LOW DIELECTRIC TANGENT

(75) Inventors: Satoru Amou, Hitachi (JP); Hiroshi Shimizu, Chikusei (JP); Akinori Hanawa, Shimotsuma (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 269 days.

(21) Appl. No.: 12/353,357

(22) Filed: Jan. 14, 2009

(65) Prior Publication Data

US 2009/0178832 A1    Jul. 16, 2009

(30) Foreign Application Priority Data

Jan. 15, 2008    (JP) .................................. 2008-005620

(51) Int. Cl.
*H05K 1/00*    (2006.01)

(52) U.S. Cl. .......................... 174/258; 174/257; 174/250

(58) Field of Classification Search .......... 428/199–200; 442/117, 181, 292–293
See application file for complete search history.

(56) References Cited

U.S. PATENT DOCUMENTS

| | | | | |
|---|---|---|---|---|
| 4,283,322 | A * | 8/1981 | Temple | 524/522 |
| 2003/0141104 | A1* | 7/2003 | Bruckmann et al. | 174/256 |
| 2006/0177666 | A1* | 8/2006 | Kawabe | 428/411.1 |
| 2007/0077413 | A1* | 4/2007 | Amou et al. | 428/323 |

FOREIGN PATENT DOCUMENTS

| | | |
|---|---|---|
| JP | 47-051952 | 12/1972 |
| JP | 54-036380 | 3/1979 |
| JP | 02-061131 | 3/1990 |
| JP | 07-268756 | 10/1995 |
| JP | 09-074255 | 3/1997 |
| JP | 09-118759 | 5/1997 |
| JP | 09-246429 | 9/1997 |
| JP | 11-124491 | 5/1999 |
| JP | 2002-249531 | 9/2002 |
| JP | 2003-012710 | 1/2003 |
| JP | 2003-105036 | 4/2003 |
| JP | 2004-083680 | 3/2004 |
| JP | 2004-099376 | 4/2004 |
| JP | 2005-033669 | 2/2005 |
| JP | 2005-089691 | 4/2005 |
| JP | 2006-299153 | 11/2006 |
| JP | 2007-099893 | 4/2007 |
| JP | 2008-094889 | 4/2008 |

OTHER PUBLICATIONS

U.S. Appl. No. 12/105,328, filed Apr. 18, 2008, Amou et al.

* cited by examiner

*Primary Examiner* — Tuan T Dinh
(74) *Attorney, Agent, or Firm* — Antonelli, Terry, Stout & Kraus, LLP.

(57) ABSTRACT

A prepreg comprising composite woven cloth or non-woven cloth composed of glass fiber and polyolefin fiber that are a main part of the cloth and a thermosetting resin composition that gives a cured product having a low thermal expansion coefficient, wherein the thermal expansion coefficient of the cured resin composition at 50 to 100° C. is 50 ppm/° C. or less, is disclosed. A printed circuit board, multi layered circuit board, and electronic part are disclosed.

14 Claims, 2 Drawing Sheets

PREPREG AND ITS APPLICATION PRODUCTS FOR LOW THERMAL EXPANSION AND LOW DIELECTRIC TANGENT

CLAIM OF PRIORITY

The present application claims priority from Japanese patent application serial No. 2008-5620, filed on Jan. 15, 2008, the content of which is hereby incorporated by reference into this application.

FIELD OF THE INVENTION

The present invention relates to a prepreg and its application products having a low dielectric tangent and a low thermal expansion coefficient, which meet electronic devices for dealing with high frequency signals. The application products have cured products of the prepreg as an insulator and include laminates, printed substrates, printed circuit boards, multi-layered printed circuit boards, etc.

RELATED ART

In recent years, a signal band of information communication devices such as portable phones and a CPU clock time of computers have a progress towards high frequency and have reached a GHz band level.

A transmission loss of electric signals is represented by a sum of dielectric tangent, conductor loss and radiation loss; the higher the frequency of the electric signals, the larger the dielectric tangent, conductor loss and radiation loss become.

Since the transmission loss attenuates electric signals to spoil reliability of the electric signals, it is necessary to take countermeasures to control an increase in the dielectric tangent, conductor loss and radiation loss in case of printed circuit boards that deal with high frequency signals. The dielectric tangent is proportional to a root of a dielectric constant of an insulator constituting the circuit and to a product of the dielectric tangent and frequency of signals used. Therefore, it is possible to suppress an increase in the dielectric tangent by selecting insulating materials having small dielectric constant and dielectric tangent.

Typical materials with low dielectric constant and low dielectric tangent are shown below.

Since fluorine resins such as polytetrafluoroethylene (PTFE) resins have low dielectric constant and dielectric tangent, it has been used for a long time as substrate materials for high frequency use. On the other hand, various non-fluorine insulating materials having low dielectric constant and low dielectric tangent that are easily made into varnish with organic solvents, have low molding temperature and low curing temperature and are easy to be handled have been investigated. For example, patent document Nos. 1, 2 disclose that diene polymers such as polybutadiene are impregnated into a fibrous substrate such as glass cloth and the resin is cured with a peroxide; patent document No. 3 discloses a mixture comprising cyanate ester, diene polymer, and epoxy resin is heated to make a B stage composition; patent document No. 4 discloses a modified resin comprising polyphenylene ether, diene polymer and triallyl isocyanate; patent document No. 5 discloses a resin composition comprising allylated polyphenylene ether triallyl isocyanate, etc; patent document Nos. 6, 7 and 8 disclose across linking component of polyfunctional polystyrene compounds having hydrocarbon structures.

On the other hand, along with the development of the dielectric characteristics of the resin materials, investigations of low dielectric constant and improvements in low dielectric tangent of the woven cloths or non-woven cloths (hereinafter referred to as fibrous substrate) into which the resin materials are impregnated have been conducted. For example, patent document No. 9 discloses cloth comprising PTFE fiber and E glass fiber or D glass fiber; patent document No. 10 discloses non-woven cloth made of polypropylene fiber; patent document No. 11 discloses non-woven cloth made of cyclic polyolefin fiber; patent document No. 12 discloses NE glass cloth wherein a composition of silicon oxide, aluminum oxide and boron oxide is prescribed; patent document No. 13 discloses non-woven cloth of quartz glass fiber; patent document No. 14 discloses cloth comprising quartz glass fiber and other glass fiber than quartz glass fiber. Among the above fibrous substrates it is considered that the woven cloth and non-woven cloth made of quartz glass fiber have the lowest dielectric tangent.

There are many investigations on low dielectric tangent materials composed of composite materials of the low dielectric tangent fibrous substrates and low dielectric tangent resin materials. Patent document No. 14, 15 disclose a composite material comprising a resin whose base is polyfunctional styrene compound and various low dielectric constant, low dielectric tangent fibrous substrates; patent document No. 16 discloses that a cured product of a prepreg comprising cloth of quartz glass fiber is impregnated with a resin composition containing polyfunctional styrene compound as a cross linking agent exhibits a dielectric tangent as low as 0.0009 at 10 GHz.

However, it is pointed out that quartz glass with good dielectric characteristics is hard, and its drilling workability is poorer and more expensive than other materials. Cloths of D glass and NE glass have a large dielectric tangent, compared with that of quartz glass fiber. Cloths or non-woven cloths using PTFE fiber or polyolefin fiber have a large thermal expansion coefficient. Since PTFE fiber has poor wettability with impregnating resin composition, interface separation tends to occur. Because of moisture induced by the interface separation, an increase in dielectric tangent and degradation of solder resistance may be observed, and a corrosive gas such as hydrogen fluoride gas etc. may be generated when the resin is combusted for disposal.

The present inventors have investigated applications of composite fibrous substrates comprising quartz glass fiber and polyolefin fiber. By the composite materials, the inventors aimed at lightweight of fibrous substrates, improvement of machinability, and reduction in cost. During the investigations, it has been revealed that printed circuit boards using composite fibrous substrates of polyolefin fiber and quartz glass fiber exhibited extremely low dielectric constant and low dielectric tangent. However, it was discovered that thermal expansion coefficient of the printed circuit boards using the composite fibrous substrates of polyolefin fiber and quartz glass fiber in Z direction (in a direction of the prepreg) was larger than that in case of a printed circuit board using the glass fiber substrate.

In multilayered printed circuit boards, the wires among the layers are connected by means of through-holes with conductivity by a conductive paste or blind via holes. Accordingly, if the thermal expansion coefficient in Z-direction is large, there may be a fair that an increase in conductor resistivity and disconnection of circuits by deformation and breakage of conductor layers such as plate films or conductive paste in the through-holes, blind via holes, etc, which are caused by processing and/or environmental temperatures. These problems may be effectively eliminated by reducing the thermal expansion coefficient in a Z-direction of a cured product of the prepreg to 100 ppm/° C. or less, particularly to 50 ppm/° C. or less.

Patent document No. 1 Japanese patent publication S47-51952

Patent document No. 2 Japanese patent publication S58-21925

Patent document No. 3 Japanese patent laid-open H11-124491

Patent document No. 4 Japanese patent laid-open H9-118759

Patent document No. 5 Japanese patent laid open H9-246429

Patent document No. 6 Japanese patent laid-open 2002-249531

Patent document No. 7 Japanese patent laid-open 2003-12710

Patent document No. 8 Japanese patent laid-open 2003-105036

Patent document No. 9 Japanese patent laid-open H2-61131

Patent document No. 10 Japanese patent laid-open H7-268756

Patent document No. 11 Japanese patent laid-open 2006-299153

Patent document No. 12 Japanese patent laid-open H9-74255

Patent document No. 13 Japanese patent laid-open 2004-99376

Patent document No. 14 Japanese patent laid-open 2005-33669

Patent document No. 15 Japanese patent laid-open 2004-83680

Patent document No. 16 Japanese patent laid-open 2005-89691

SUMMARY OF THE INVENTION

The present invention aims at provide a prepreg such as fibrous substrate materials, film materials with controlled low thermal expansion and low dielectric tangent, suppressing a cost thereof and decrease in workability, and to provide electronic parts using the insulating material for high frequency.

The present invention achieves the above object by the following means.

(1) A prepreg comprising composite woven cloth or non-woven cloth composed of glass fiber and polyolefin fiber that are a main part of the cloth and a thermosetting resin composition that gives a cured product having a low thermal expansion coefficient, wherein the thermal expansion coefficient of the cured resin composition at 50 to 100° C. is 50 ppm/° C. or less. The main part is used to mean the fibrous composition, which may contain a small amount of other fibrous material than the glass fiber and polyolefin fiber within an object of the present invention. The total amount of the glass fiber and polyolefin fiber in the fibrous component should preferably be 95 wt % or more, particularly, 98 wt % or more, and most particularly 100 wt %.

(2) The prepreg containing the thermoset resin described in (1) having a thermal expansion of 50 ppm/° C. or less at 50 to 100° C.

(3) The prepreg defined in (1) or (2) wherein the main part of the cloth or non-woven cloth consists of 40 to 60 wt % of glass fiber and 60 to 40 wt % of polyolefin fiber contains the thermoset resin with the low thermal expansion coefficient, a content of the resin is 45 wt % to 98 wt % based on the total weight of the fibrous material and the resin.

(4) The prepreg defined in any one of (1) to (3) wherein a content of the polyolefin fiber is 1 to 18 wt % based on the weight of the fibrous material.

(5) The prepreg as defined in any of (1) to (4) wherein a dielectric tangent of the thermoset resin with the low thermal expansion coefficient is 0.005 or less at 1 GHz.

(6) The prepreg as defined in any one of (1) to (5) wherein the glass fiber is quartz glass fiber.

(7) The prepreg as defined in any one of (1) to (6) wherein the resin composition with the low thermal expansion coefficient contains at least one of polybutadiene compounds represented by the formula 1, polyfunctional styrene compounds represented by the formula 2, and bismaleimide compounds represented by the formula 3, and polyphenylene ether compounds having curable functions, and silicon oxide filler and a silane coupling agent.

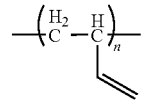

Formula 1

(In the formula, n is an integer of 20 or more, and a molecular weight (polystyrene conversion weight average molecular weight measured by Gel Permeation Chromatography) is 1000 or more.)

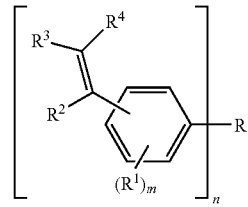

Formula 2

(In the formula, R represents a hydrocarbon chain, $R^1$ hydrogen or a hydrocarbon group having a carbon number of 1 to 20, $R^1$ being the same or different, $R^2$, $R^3$ and $R^4$ hydrogen or hydrocarbon group having a carbon number of 1 to 6, $R^2$, $R^3$ and $R^4$ being the same or different, m is an integer of 1 to 4, n is an integer of 2 or more, and a molecular weight by Gel Permeation Chromatography is 1000 or less.)

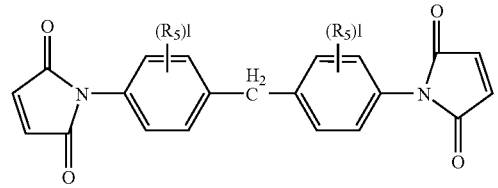

Formula 3

(In the formula, $R^5$ is a hydrocarbon having a carbon number of 1 to 4, $R^5$ being the same or different, and l is an integer of 1 to 4.)

(8) The prepreg defined in (7) wherein the resin composition with the low thermal expansion coefficient contains a flame retardant agent having a specified molecular structure defined by formula 4 and formula 5, hydrogenated styrene-butadiene copolymer, and a radical polymerization stator and/or a radical polymerization inhibitor.

(9) A laminate of the thermoset resin defined in any one of (1) to (8), the laminate having conductor layer on one or both faces thereof.

Formula 4

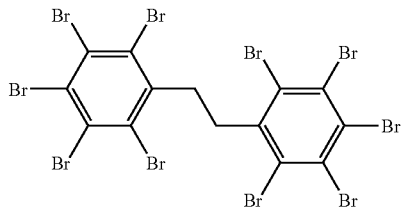

Formula 5

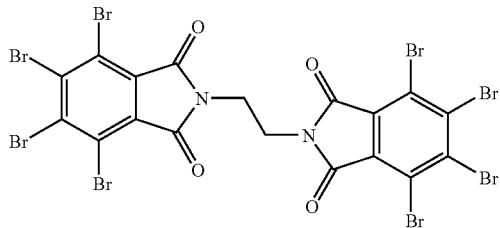

(10) A printed circuit board having the conductor defined in (9), the conductor being processed into circuits.

(11) The printed circuit board defined in (10) wherein the print circuit board has an antenna circuit therein.

(12) A multi-layered printed circuit board, which is multi-layered by laminating the printed circuit boards defined in any one of (10) or (11). As prepregs for bonding the printed circuit boards, the prepregs defined in any one of (1) to (8).

The present invention provides prepregs, laminates, printed circuit boards and multi-layered printed circuit boards, which have a low thermal expansion coefficient in Z-direction (thickness direction of laminates) and low dielectric tangent, avoiding an increase in material cost and reduction in machinability.

Figure 1:
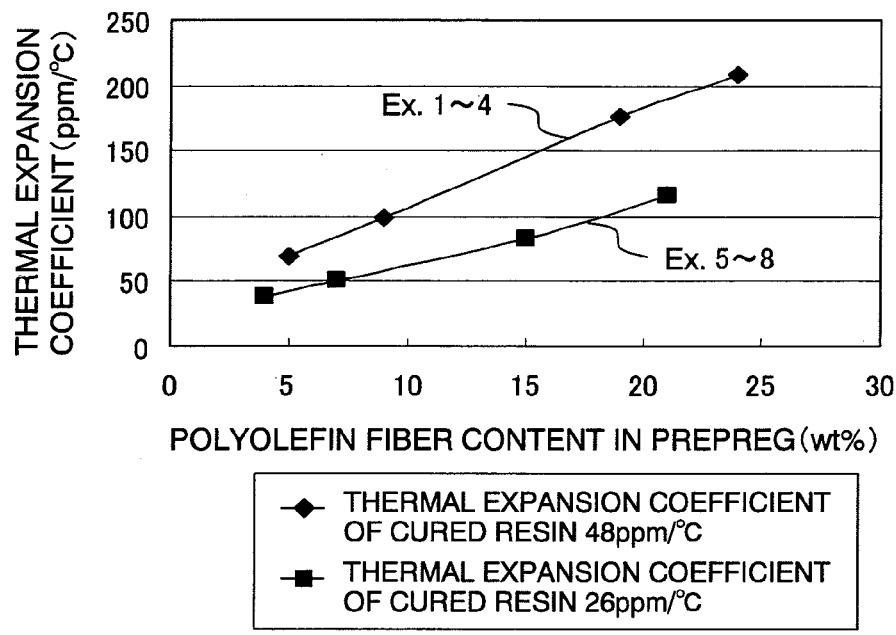
FIG. 1 is a graph showing a relationship between a content of polyolefin fiber in the prepreg and a thermal expansion coefficient in Z-direction of a laminate in examples 1 to 8.

Reference numerals in the drawings are 1; copper foil, 2; laminated and cured prepreg, 3; photoresist antenna pattern, 4; photoresist through-hole pattern, 5; antenna pattern, 6; through-hole pattern, 7; printed circuit, 8; through-hole, 9; silver paste, 10; ground, 11; copper foil layer, 12; prepreg.

DETAILED DESCRIPTION OF THE PREFERRED EMBODIMENTS

At first, methods of preparing the fibrous substrates and preferable materials will be explained.

The composite cloths composed of glass fiber and polyolefin fiber are prepared preferably from composite strings consisting of glass fiber and polyolefin fiber. Since the glass fiber and polyolefin fiber have different elongation rate respectively, twist wrinkles may occur in the cloth due to difference in their elongation when strings of glass fiber and strings of polyolefin fiber are woven. Diameters of glass fiber and polyolefin fiber are preferably in 5 to 20 µm. If the diameter is too large, bent pints of the fibrous substrate in the cloth become rough or coarse and the uneven face of the cloth becomes rough so that appearance of the prepreg and laminates will become worse. If the diameter of the fibers is too large, fibers may easily be cut in weaving the strings.

Preferable fibrous materials should be sufficiently resistive to organic solvents so as to avoid deformation or breakage of prepregs, which may be caused by dissolution or swelling of the polyolefin fiber in the fibrous substrate in steps of impregnation of the low thermal expansion resin composition into the fibrous substrate and drying the impregnated prepreg. In addition, changes of a composition of the resin composition, which may be occurred if the polyolefin fiber dissolves into the organic solvent in the resin composition are prevented.

From the viewpoints mentioned-above, a dissolvable component in the fibrous substrate to solvents should preferably be less than 5 wt %, particularly less than 1 wt %. Examples of polyolefin fibers that meet the above requirement are polymers or copolymers of a-olefin compounds such as ethylene, propylene, buten-1,4-methyl pentene-1, their mixtures, etc. The polymers and copolymers of a-olefins are preferred because of low dielectric tangent. Especially, polyethylene, polypropylene and ethylene-propylene copolymer are preferred because they are excellent in resistance to solvents. From the viewpoint of heat resistance of the fibrous substrate, it is preferable to increase a softening point and melting point of the polyolefin fiber by introducing polypropylene and polymethylpentene structures thereinto. Melting points of polypropylene and polymethylpentene are 160° C. and 230° C., respectively.

Surface of the glass fiber in the fibrous substrate should preferably be treated with silane coupling so that adhesion between the fibrous substrate and resin is remarkably improved and heat resistant characteristics such as heat resistance to solder in moisture can be improved. Examples of the silane coupling agents are Y-methaclyloxy propyldimethoxysilane, Y-methaclyloxy propyltrimethoxysilane, Y-methaclyloxy propyltriethoxysilane, vinyltrimethoxysilane, vinyltriethoxysilane, vinyltris (β-methoxyethoxy) silane, p-styryltrimethoxysilane, etc. Vinyl group silane coupling agents having functional groups that are capable of chemically bonding to the resin composition provide treated surface stability and hence they are preferred.

Other coupling agents such as silane group, titanium group, aluminum group may be used in combination with the above-mentioned silane coupling agents so as to introduce lubricating components to prevent breakage of glass fiber at the time of handling thereof for preparing the fibrous substrate.

Next, the present invention will be explained in detail. In laminates or printed circuit boards, which is a cured products of prepregs wherein thermosetting resin is impregnated into cloth or non-woven cloth composed of glass fiber and polyolefin fiber, thermal expansion coefficients in X, Y directions can be controlled to 10 to 30 ppm/° C. by virtue of the glass fiber. On the other hand, there were some cases where the thermal expansion coefficient in Z-direction exceeded 200 ppm/° C. at 50 to 100° C. In the following, the thermal expansion coefficients are values measured at 50 to 100° C., except otherwise explained. The lowering of thermal expansion coefficient of the resin composition is an effective measure to reduce the thermal expansion coefficient of the laminates and printed circuit board in the Z-direction.

The thermal expansion coefficient of the laminates and printed circuit boards in Z-direction to prevent disconnection of circuits between layers and an increase in conductor resistivity should preferably be 100 ppm/° C. or less, particularly 50 ppm/° C. When copper is used for the circuits, the lower limit of the thermal expansion coefficient is approximately the thermal expansion coefficient of copper, which is 20 ppm/° C.

In order to control the thermal expansion coefficient in Z-direction of the laminates and printed circuit boards that use the glass fiber and polyolefin fiber, resin compositions that can provide cured products with a thermal expansion coefficient of 50 ppm/° C. or less, particularly 30 ppm/° C. or less should be used. Although there is no particular lower limit of the thermal expansion coefficient of the resin composition, it should preferably be 12 ppm/° C. or more from the viewpoint of molding property at lamination step and multilayer forming step.

The present inventors have investigated the relationship between a content of the polyolefin fiber in the prepreg and a thermal expansion coefficient in Z-direction of the laminates and printed circuit boards using the resin composition. A good relationship between the content of the polyolefin fiber and the thermal expansion coefficient was found. When a resin composition that provides a cured product having a thermal expansion coefficient of around 50 ppm/° C., the thermal expansion coefficient in Z-direction of the laminates and printed circuit boards could be controlled to 100 ppm/° C. by controlling the content of the polyolefin fiber to 10 wt % or less. When a resin composition that provides a cured product having a thermal expansion coefficient of around 30 ppm/° C., the thermal expansion coefficient in Z-direction of the laminates and printed circuit boards could be controlled to 100 ppm/° C. by controlling the content to 18 wt % or less. The employment of the low thermal expansion resin composition and reduction in the content of the polyolefin fiber in the prepreg were effective measures to lower the thermal expansion coefficient in Z-direction.

The function of the polyolefin fiber in the prepreg is to contribute to reduction in dielectric tangent and weight of the fibrous substrate when the glass fiber is E glass fiber, D glass or NE glass. When the glass fiber is quartz glass, it contributes to improvement of drilling machinability.

Further, the composite fibrous substrate composed of the glass fiber and polyolefin fiber brings about improvement of soldering heat resistance. It is though that the polyolefin fiber melts and dissolves mutually with the impregnating resin (low thermal expansion resin composition) to exhibit high bonding force at the time of press working at high temperatures. Accordingly, it is not preferable to eliminate all of the polyolefin fiber. A lower content of the polyolefin fiber in the prepreg should preferably be 1 wt % or more, more particularly 4 wt % or more.

As the glass fiber, quartz glass fiber is preferred in view of its dielectric properties.

As a means for reducing the content of the polyolefin fiber in the prepreg, fibrous substrates containing small amounts of polyolefin fibers are used. According to this method, it is possible to reduce the content of the polyolefin fiber in the prepreg and thermal expansion coefficient in Z-direction of the laminates and printed circuit boards, even when a content of the low thermal expansion resin composition is 45 to 60 wt %.

However, when the fibrous substrate having a low content of polyolefin fiber is used, advantages such as reduction in dielectric tangent and improvement of machinability by the use of the polyolefin fiber may be degraded. Accordingly, a content range of the glass fiber to polyolefin fiber in the fibrous substrate is preferably 80 to 20 wt % to 20 to 80 wt %, more particularly 60 to 40 wt % to 40 to 60 wt %.

As a means for reducing the content of the polyolefin fiber in the prepreg in case where the fibrous substrate with a high content of polyolefin fiber, an increase in an impregnation amount of the low thermal expansion resin composition is effective. A preferable content of the resin composition is 70 to 98 wt %. According to this means, it is possible to reduce a content of the polyolefin fiber in the prepreg thereby to lower the thermal expansion coefficient in Z-direction even if the fibrous substrate with high content of polyolefin fiber is used.

Next, a method of reducing the thermal expansion coefficient in Z-direction of the laminates and printed circuit boards will be explained wherein a low content of 45 to 60 wt % of the impregnated resin composition was used.

Two copper foils on which the low thermal expansion resin composition was coated and dried were prepared. A prepreg was sandwiched by the resin coated copper foils and pressed and heated to cure the prepreg to thereby produce a laminate with a conductor layer on both faces thereof. The low thermal expansion resin composition on the both faces adjusts a low content of the resin composition of the prepreg.

By adjusting a coating amount of the low thermal expansion resin composition on the copper foils, the content of the polyolefin fiber can be reduced. In this method, as same as in the case where a prepreg with a high content of the resin composition is used, the thermal expansion coefficient in Z-direction can be lowered.

Explained was the method of reducing the thermal expansion coefficient in Z-direction of the laminates and printed circuit boards by increasing the content of the low thermal expansion resin composition. Dielectric characteristics of the laminates and printed circuit boards manufactured from prepregs with a high content of the resin composition are strongly affected by dielectric characteristics of the resin composition. Accordingly, the dielectric tangent of the cured product of the low thermal expansion resin composition should be as low as possible in the laminates and printed circuit boards. Especially, the dielectric tangent of the cured product should be 0.005 or less at 1 GHz, particularly, 0.002 or less.

The low thermal expansion resin composition having the characteristics will be explained in the following.

The prepreg contains the low thermal expansion resin composition should contain at least one cross linking component selected from the group consisting of the polybutadiene compounds represented by the formula 1, polyfunctional styrene compounds represented by the formula 2, bismaleimide compounds represented by the formula 3, and polyphenylene ether compounds having a thermosettable functional group, silicon oxide filler and a silane coupling agent.

The low thermal expansion resin composition used in the present invention should preferably have low thermal expansion and low dielectric constant after being cured. As a means for realizing such the resin composition, addition of silicon oxide filler that has the low thermal expansion coefficient and low dielectric tangent to the resin composition is easy and effective. A particle size of preferred silicon oxide fillers used in the present invention is not limited, but the filler should preferably be such that the fillers do not precipitate too much in the varnish of the resin composition and have a contribution to low thermal expansion coefficient due to the large surface area thereof.

From the above point of view, the particle size of the filler should preferably be 20 μm or less, more particularly 0.2 to 3 μm. It is preferable to treat the silicon oxide filler with a silane coupling agent in order to improve dielectric characteristics, low moisture absorption and heat resistance to solder. The treatment with the silane coupling agent can be conducted by treating the filler with the agent prior to adding it to the resin composition or by adding the agent to the resin composition containing the filler.

Preferred silane coupling agents used in the present invention include Y-methacryloxypropyl dimethoxysilane, Y-methacryloxypropyl trimethoxysilane, Y-methacryloxypropyl triethoxysilane, vinyltrimethoxysilane, vinyltriethoxysilane, vinyltris(β-methoxyethoxy)silane, p-styryltrimethoxysilane, etc.

It is preferable to adjust an additive amount of the treated filler so as to give the thermal expansion coefficient of 50 ppm/° C. or less, particularly 30 ppm/° C. or less. Although the thermal expansion coefficient is affected by the thermal expansion coefficient of the resin itself, the additive amount of the filler should be 100 weight parts or more per 100 parts weight of resin composition, particularly 300 weight parts or more.

It is said that a limit of the addition of the silicon oxide filler is, roughly saying, about 75 vol % in case of a spherical form of fillers. When a specific gravity of the resin is 1 g/cm$^3$, and a specific gravity of silicon oxide is 2.65 g/cm$^3$, the upper limit is 796 weight parts per 100 weight parts of resin. When taking into consideration molding property and adhesion, etc, the additive amount of silicon oxide should preferably be 400 weight parts or less per 100 weight parts of the resin. As cross linking agents used in the present invention, polybutadiene compounds and polyfunctional styrene compounds having hydrocarbon chains are preferred from the viewpoint of reduction in dielectric tangent of the cured product. Among hetero compounds having hetero elements in the molecular structure, specified bismaleimide compounds and curable phenylether compounds are preferred. These cross linking agents have excellent low dielectric tangent. In the following, examples of the cross linking agents are explained.

Examples of the polybutadiene compounds include polybutadienes with side chains having vinyl groups. Polybutadienes whose 90 wt % or more is 1,2-bonds are preferred in view of curability and heat resistance of the cured product. B1000, B2000 and B3000, which are manufactured by Nippon Soda Co., Ltd. have a molecular weight of 1000 to 3000 in number average, and RB810, RB820 and RB830, which are manufactured by JSR Corporation have a molecular weight of over 100 thousand in number average. These polybutadiene compounds can be used singly or in combination.

Examples of polyfunctional styrene compounds are disclosed in Japanese patent laid-open 2004-87639, which are of wholly hydrocarbon chains, and include 1,2-bis (p-vinylphenyl)ethane, 1,2-bis(m-vinylphenyl)ethane, 1-(p-vinylphenyl)-2-(m-vinylphenyl)ethane, bis(p-vinylphenyl)methane, bis(m-vinylphenyl)methane, p-vinylphenyl-m-vinylphenyl-methane, 1,4-bis(p-vinylphenyl)benzene, 1,4-bis(m-vinylphenyl)benzene, 1-(p-vinylphenyl)benzene-4-(m-vinylphenyl)benzene, 1,3-bis(p-vinylphenyl)benzene, 1,3-bis(m-vinylphenyl)benzene, 1-(p-vinylphenyl)-3-(m-vinylphenyl)benzene, 1,3-bis(p-vinylphenyl)benzene, 1,3-bis(m-vinylphenyl)benzene, 1-(p-vinylphenyl)-3-(m-vinylphenyl)benzene, 1,6-bis(p-vinylphenyl)hexane, 1,6-bis(m-vinylphenyl)hexane, 1-(p-vinylphenyl-6-(m-vinylphenyl)hexane, divinylbenzene polymer (olygomer) having vinyl groups on side chains, etc. These compounds are used singly or in combination.

When these polyfunctional styrene compounds are used as cross linking agents, the resin composition can be cured without using any curing catalyst because activity of the styrene groups are high. Thus, the influence of the curing catalyst on the increase in dielectric tangent will be suppressed, which means these compounds are particularly useful for high frequency insulation use.

The bismaleimide compounds represented by the formula 3 exhibit low dielectric tangent for bismaleimide compounds, while the dielectric tangent is not low as that of the polyfunctional styrene compounds. It is thought that the low dielectric tangent is caused by suppression effect of alkyl groups (Rs), which is called sterific hindrance. As examples of the specified bismaleimide compounds include bis(3-methyl-4-maleimidephenyl)methane, bis(3,5-dimethyl-4-maleimidephenyl) methane, bis(3-ethyl-4-maleimidephenyl)methane, bis (3-ethyl-5-methyl-4-maleimidephenyl methane, bis(3-n-butyl-4-maleimidephenyl methane, etc.

Curable polyphenylene ether can be cured, while preventing an increase in a cross linking density. It mutually dissolves with hydrogenated styrene-butadiene, which has no reactivity, and contributes to an increase in Tg of the composition system, suppression of dissolving-out of styrene-butadiene, and improves tack-free property. Due to suppression of the increase in the cross linking density, the curable polyphenylene ether improves adhesion between the conductor layer and cured prepreg.

Examples of the curable polyphenylene ethers are polyphenylene ethers modified with maleic acid anhydride, polyphenylene ethers modified with allyl disclosed in Japanese patent laid-open H9-246429, thermosetting polyphenylene ethers having relatively small molecular weight disclosed in Japanese patent laid-open 2003-160662, Japanese patent laid-open 2003-252983, and Japanese patent laid-open 2005-60635. These polyphenylene compounds have low dielectric tangent for compounds containing hetero elements.

These cross linking components can be used in combination in order to adjust tack-free property, thermal characteristics, dielectric characteristics, and crack resistance. Within a allowable range of the dielectric characteristics, second cross linking agent such as epoxy resins, cyanate ester resins, etc may be added.

Next, the flame retardant agents represented by formula 4 and 5, hydrogenated styrene-butadiene copolymer, radical polymerization catalysts and radical polymerization inhibitors will be explained.

Flame retardant property of electronic parts is often required from the viewpoint of safety; thus, in resin materials flame retarding means by adding flame retardant agents has been widely employed. The flame retardant agents represented by the aforementioned formulae have low dielectric tangent and they are particularly suitable for electronic parts for high frequency use. In particular the present invention, polybutadiene, bismaleimide compounds with the specified chemical structure and curable polyphenyrene ethers are suitable for the low thermal expansion resin composition because they contribute to lowering of dielectric tangent of the cured product.

When an average particle size of the flame retardant agent is 0.2 to 3.0 μm, precipitation of the flame retardant agent in varnish is avoided, thereby to improve stability of the varnish. Depending on viscosity of the varnish, the precipitation of the retardant agent having the above-mentioned particle size and silicon oxide filler in varnish having a viscosity of 0.1 to 1.0 Pa·s (Pascal sec.) can be prevented An additive amount of the flame retardant agent is 10 to 150 weight parts per 100 weight parts of the resin component. The amount is decided in accordance with the flame retardant required for the resin composition.

The hydrogenated styrene-butadiene copolymer does not have polar groups in the molecule; the polymer contributes to reduction in dielectric tangent of the cured product of the low thermal expansion resin composition. The lowering effect of the copolymer is larger than that of non-hydrogenated styrene-butadiene copolymer. Since the copolymer lowers a cross linking density and gives the cured product flexibility, it contributes to improvement of adhesion between the conductor layer and the cured product of the prepreg.

Examples of hydrogenated styrene-butadiene copolymers are TAFTEC (registered trademark) on the market in the names of H1031, H1041, H1043, H1051, H1052, etc. manufactured by Asahi Kasei Chemicals Corporation. In the resin composition containing the polyfunctional styrene compounds and the bismaleimide compounds having specified chemical structure, it is preferable to use the hydrogenated styrene-butadiene copolymer having a content of styrene residues in 30 to 70 wt %.

It is possible to obtain cured products with high glass transition temperature, avoiding phase separation, which may take place when the curable polyphenylene ether is used. In case of the resin composition containing polybutadiene as the cross linking agent, it is preferable to use hydrogenated styrene-butadiene copolymer having styrene residue groups of 10 to 30 wt %.

Further, the phase separation is prevented in the case where the curable polyphenylene ether compounds are used so that cured products with high glass transition temperature are obtained. An additive amount of hydrogenated styrene-butadiene copolymers is preferably 10 to 50 wt % per 100 weight parts of the total amount of the cross linking agents, particularly 10 to 30 wt %. In the above range, the resistance to solvents, film forming property, tack-free property, etc are controlled.

The radical polymerization initiators accelerate curing reaction of the resin composition. It is possible to select kinds of the radical polymerization initiators so as to adjust curing reaction start temperature. Particularly, in the low thermal expansion resin composition containing polybutadiene as a cross linking agent, a curing degree of the resin composition can be controlled.

As radical polymerization initiators, there are isobutyl peroxide, a, a'-bis(neodecanoylperoxy)diisopropylbenzene, cumylperoxy neodecanoate, di-n-prolylperoxy dicarbonate, 1,1,3,3-tetramethylbutylperoxy neodecanoate, diisopropylperoxy dicarbonate, 1-cyclohexyl-1-methylethylperoxy neodecanoate, di-2-ethoxyethylperoxy dicarbonate, di(2-ethylhexylperoxy)dicarbonate, t-hexylperoxy neodecanoate, dimethoxybutylperoxy didecanoate, di(3-methyl-3-methoxybutylperoxy)dicarbonate, t-butylperoxy neodecanoate, t-hexylperoxy pivalate, t-butylperoxy pivalate, 3,5,5-trimethylhexanoilperoxide, octanoylperoxide, 1,1,3,3-tetramethylbutylperoxy-2-ethylhexanoate, 2,5-dimethyl-2,5-di(2-ethylhexanooylperoxy)hexane, 1-cyclohexyl-1-methylethylperoxy-2-ethylhexanoate, t-hexylperoxy-2-ethylhexanoate, t-butylperoxy-2-ethylhexanoate, t-butylperoxy-2-ethylhexanoate, m-toluoylperoxide, t-butylperoxyisobutylate, a,a'-bis(t-butylperoxy)diisopropylbenzene, dicumylperoxide, 2,5-dimethyl-2,5-di(t-butylperoxy) hexane, t-butylcumylperoxide, di-t-butylperoxide, 2,5-dimethyl-2,5-di(butylperoxy)hexine-3, t-butyltrimethylsilylperoxide. The initiators can be used singly or in combination. An additive amount is 0.0005 to 20 weight parts per 100 weight parts of the resin component.

The polymerization inhibitors suppress the curing reaction by heating at the time of preparing the varnish and prepreg, and they stabilize the prepreg during storage thereof. Examples of the inhibitors are quinines and aromatic diols such as hydroquinone, p-benzoquinone, chloranil, trimethylquinone, 4-t-butylpyrocatecol, etc. A preferred additive amount range is 0.0005 to 5 weight parts per 100 weight parts of the resin composition. Organic solvents for preparing varnishes should preferably have a boiling point of 140° C. or lower. Examples of the solvents are xylene, toluene and cyclohexane. More preferable solvents have a boiling point of 110° C. or lower, examples of which are toluene and cyclohexane. These solvents are used singly or in combination. The solvents may contain polar solvents such as methylethylketone, methanol, etc, which are used for silane coupling treatment.

The prepreg can be prepared by impregnating varnish into the fibrous substrate and drying the impregnated fibrous substrate. Drying conditions are preferably 80 to 150° C., particularly 80 to 110° C. and drying time is preferably 10 to 90 minutes.

A laminate is prepared by forming a conductor layer on one or both faces of the cured prepreg. According to this method, it is possible to manufacture various types of printed circuit boards having low thermal expansion coefficient and low dielectric tangent.

The printed circuit boards manufactured from the laminate of the present invention have insulation layer with low dielectric tangent; the printed circuit boards exhibit low dielectric tangent at high frequency. Therefore, the printed circuit boards are suitable for printed circuits and antenna substrate for high frequency use.

Multilayered printed circuit boards, which are manufactured by laminating the printed circuit boards and bonding them with prepregs sandwiched between the printed circuit boards, suitable for high frequency use.

Electronic parts that use an insulation layer of the cured prepreg of the present invention has low dielectric tangent; a higher frequency band can be utilized so that a wide frequency band communication and high speed communication can be realized by increasing signal density. Examples of electronic parts include backplanes such as high frequency antenna circuits, high speed servers, rooters, etc., and high speed transmission flexible printed circuit boards used for hard disc drivers, facsimile machines, etc.

EXAMPLES

In the following examples and comparative examples are shown to explain the present invention in more detail; however, the scope of the present invention is not limited to these examples. Ingredients, methods of synthesis, preparation method of varnish and method of evaluation of cured products are shown in the following.

[Synthesis of 1,2-bis(vinylphenyl)ethane (BVPE)] 5.36 grams (220 mmol) of magnesium granules for Grignard reaction (manufactured by Kanto Chemical Co., Ltd.) was charged in a three necked flask of 500 mL, and a dropping funnel, nitrogen gas introduction tube and a septum cap were installed to the flask. The reaction system was heated and moisture was removed under nitrogen stream and stirring the magnesium granules.

300 mL of dried tetrahydrofuran was taken into a syringe and it was charged in the flask through the septum cap. After the solution was cooled down to −5° C., 30.5 g (200 mmol) of vinylbenzylchloride (manufactured by Tokyo Kasei Corp.) was dropped into the flask with the dropping funnel in about 4 hours. After the dropping was finished, stirring of the solution at 0° C. continued for 20 hours. After the reaction finished, magnesium was removed by filteration, and the solution was concentrated by an evaporator.

The reaction solution was diluted with hexane, washed one time with 3.6% hydrochloric acid aqueous solution and rinsed three times with pure water, followed by dehydration with magnesium sulfate. The dehydrated solution was purified by passing through a short column of silica gel/hexane (Wako Gel C300 manufactured by Wako Pure Chemical Industries Ltd.) and the solution was subjected to vacuum drying to obtain desired BVPE.

The resulting BVPE was a mixture of 1,2-bis(p-vinylphenyl)ethane (PP, solid), 2-bis-(m-vinylphenyl)ethane (mm, liquid), and 1-(p-vinylphenyl)-2-(m-vinylphenyl) ethane (mp, liquid), and a yield was 90%.

The chemical structure of the product revealed by $^1$H-NMR was revealed to show that the structure was the same as on the literature (6H-vinyl: a-2H(6,7),β-4H (5.7,5.2); 8H-aromatic (7.1 to 7.4; 4H-methylene (2.9). The resulting BVPE was used as a cross linking agent.

[Bismaleimide]

BMI-5100, which is 3,3'-dimethyl-5,5'-diethyl-4,4'-diphenyl methane bismaleimide (manufactured by Daiwa Kasei K. K.)

[Polybutadiene]

RB810, which has a number average molecule of 130,000 based on a styrene conversion and has a 1,2-bonds of at least 90% (manufactured by JSR Corporation).

B3000, which has a number average molecule of 3,000 based on a styrene conversion, and has 1,2-bonds of at least 90% (manufactured by Nippon Soda, Co., Ltd.).

[Styrene-Butadiene Copolymer]

TAFTEC (registered trade mark) H1031, which contains styrene of 30 wt % (manufactured by Asahi Chemicals Ltd.)

TAFTEC (registered trade mark) H1031, which contains styrene of 42 wt % (manufactured by Asahi Chemicals Ltd.)

[Curable Polyphenylene Ether]

OPE2St, which has a number average molecule of 2200 based on a styrene conversion, and has both ends being ethylene groups (manufactured by Mitsubishi Gas Chemical Co., Inc.)

[Curing Catalyst]

2,5-dimethyl-2,5-di(t-butylperoxy) hexine-3 (abbreviation; 25B, manufactured by NOF Corporation)

[Polymerization Inhibitor]

t-butyl hydroquinone (abbreviation; tBHQ, manufactured by Wako Pure Chemicals)

[Flame Retardant]

SAYTEX8010, which is 1,2-bis(pentabromophenyl) ethane having an average particle size of 1.5 μm (manufactured by Albemarle Japan Corporation)

[Silicon Oxide Filler]

Admafine, which has an average particle size of 0.5 μm (manufactured by Admatechs Co., Ltd.)

[Coupling Agent]

KBM-503, which is Y-methacryloxypropyl dimethoxy silane (manufactured by Shin-Etsu Chemical)

[Copper Foil]

AMFN1/2 Oz, which is treated with a coupling agent, and has a thickness of 18 μm, and Rz≈2.1 μm (manufactured by Nikko Materials Corp.)

[Quartz Glass Fiber/Polyolefin Fiber Cloth]

Cloth No. 1 is composed of mixed spun fiber of quartz glass fiber and polypropylene fiber (manufactured by Shin-Etsu Quartz Products Co., Ltd.). A polyolefin fiber content is 40 wt%.

Cloth No. 2 is composed of mixed spun fiber of quartz fiber and polypropylene fiber (manufactured by Shin-Etsu Quartz Products Co., Ltd.). A content of polypropylene fiber is 50 wt%.

Cloth No. 3 is composed of mixed spun fiber of quartz fiber and polypropylene fiber (manufactured by Shin-Etsu Quartz Products Co., Ltd.). A content of polypropylene fiber is 60 wt%.

Cloth No. 4 is composed of polypropylene fiber (manufactured by Shin-Etsu Quartz Products Co., Ltd.)

[A Method of Preparing Varnish]

Predetermined amounts of the silane coupling agent and filler were stirred in methyl ethyl ketone solvent with a ball mill for 2 hours to treat the filler with the silane coupling agent. Thereafter, predetermined amounts of the resin components, flame retardant, curing catalyst, and toluene were added to the filler. The mixture was thoroughly kneaded for about 8 hours until the resin components were completely dissolved to prepare varnish. A concentration of the varnish was 40 to 50 wt %.

[A Method of Preparing a Cured Product (Resin Plate)]

The varnish was coated on PET film and it was dried at room temperature for one night and at 100° C. for 10 minutes. Then, it was heated and pressed in vacuum to obtain a cured product. Curing conditions were: in vacuum the sample was pressed under 2 MPa from room temperature, and temperature was elevated at a constant rate (6° C./min.) to 230° C. at which the sample was held for 60 minutes.

[A Method of Preparing Prepreg]

After the above-mentioned cloths were dipped in the varnish, the cloths were lifted at a constant speed from the varnish. The impregnated cloths were dried to obtain prepregs. The drying condition was 100° C./10 min.

[A Method of Preparing a Copper Clad Laminate]

4 prepregs prepared by the above method were laminated, and they were sandwiched with copper foils. The laminate was heated and pressed with a vacuum pressing machine. The curing conditions were: The laminate was pressed under 2 MPa from room temperature and temperature was elevated at a constant rate (6 □/min.) to 230 □ at which the laminate was held for 60 minutes.

[Measurement of Specific Dielectric Constant and Dielectric Tangent]

By a cavity resonance method using 8722ES type network analyzer manufactured by Agilent Technology Inc. and a cavity resonator manufactured by Kantoh Electronics Application and Development Inc., the specific dielectric constant and the dielectric tangent were measured at 10 GHz. The copper clad laminate was subjected to removing the copper foil by etching, and was cut into a piece of 1.0 mm×80 mm. A sample prepared fro the cured resin plate was cut into a piece of 1.0 mm×1.5 mm×80 mm.

[Test of Heat Resistance to Solder]

After the copper foils were removed by etching, the laminate was cut into a piece of 20 mm×20 mm. After the piece was dried at 105° C. for 1 hour, the piece was dipped in a solder bath for 20 seconds. Thereafter, the piece was investigated whether the piece has peeling in the four prepregs constituting the piece.

A heat resistance to solder after moisture absorption was conducted as follows. After the copper foils were removed by etching, the laminate was cut into a piece of 20 mm×20 mm. After the piece was held in a saturated steam at 121° C. for 20 hours, the piece was dipped in a solder bath at 260° C. for 20 seconds. The piece was investigated whether it had pealing.

Comparative Example 1

Comparative example 1 relates to a low thermal expansion resin composition comprising polybutadiene and thermosetting polyphenylene ether as cross linking agents. The cured product had a thermal expansion coefficient (a1) and dielectric characteristics are shown in Table 1.

The cured resin exhibited dielectric tangent of 0.0017, and a thermal expansion coefficient in Z direction was 48 ppm/° C. Thus, the cured resin had low thermal expansion and low dielectric tangent characteristics, and are suitable for applications of high frequency electronic devices.

Examples 1-4

Examples 1-4 relate to cured prepregs (hereinafter referred to as laminates) which use cloth No. 2 containing 50 wt % of polyolefin fiber as a fiber substrate, the resin composition in comparative example 1 as a low thermal expansion coefficient resin composition. Characteristics of the laminates are shown in Table 1. The dielectric tangent of the laminates was 0.0009 to 0.0015. The values were lower than that of cured resin composition by virtue of employing low dielectric tangent fiber substrate. It was confirmed that the thermal expansion coefficient in Z direction decreased as an amount of resin content in the prepregs, i.e., an amount of polyolefin fiber decreased.

FIG. 1 shows a relationship between a content of polyolefin fiber in prepregs and a thermal expansion coefficient in Z direction of the laminate. The laminates of the present invention exhibited excellent heat resistance to solder before and after moisture absorption. From the above results, the prepregs and laminates according to the present invention are excellent in dielectric characteristics, low thermal expansion coefficient and heat resistance, which are suitable for insulating materials of high frequency electronic devices.

Table 1 shows resin compositions, fiber substrate compositions, and characteristics of the laminates using the prepregs. In Table 1, a resin having a thermal expansion coefficient of 50 ppm/° C. was used.

TABLE 1

| Name of materials | Product name | Comp. Ex. 1 | Ex. 1 | Ex. 2 | Ex. 3 | Ex. 4 |
| --- | --- | --- | --- | --- | --- | --- |
| Low molecular weight polybutadiene | B3000 | | | 38.5 | | |
| High molecular weight polybutadiene | RB810 | | | 38.5 | | |
| Curable polyphenylene | OPE2St | | | 7.6 | | |
| High molecular weight polymer | H1031 | | | 15.4 | | |
| Flame retardant | SAYTEX8010 | | | 87 | | |
| Filler | SO25R | | | 77 | | |
| Coupling agent | KBM503 | | | 0.1 | | |
| Initiator | Perhexine25B | | | 0.3 | | |
| Fiber substrate | PP/quartz wt ratio | — | | 50/50 | | |
| | Weight (G/m$^2$) | — | | 73 | | |
| Characteristics of laminate | Resin content (wt %) | 100 | 52 | 62 | 82 | 90 |
| | PP content in the laminate (wt %) | 0 | 24 | 19 | 9 | 5 |
| | Specific dielectric constant at 10 GHz | 2.6 | 2.6 | 2.6 | 2.6 | 2.6 |
| | Dielectric tangent at 10 GHz | 0.0017 | 0.0009 | 0.0011 | 0.0014 | 0.0015 |
| | a1 in Z direction (ppm/° C.) 50-100° C. | 48 | 208 | 176 | 99 | 69 |
| | Solder heat resistance at 260° C. (normal state) | — | Good | Good | Good | Good |
| | Solder heat resistance at 260° C. after humid-absorption (PCT20h) | — | Good | Good | Good | Good |

Comparative Example 2

Comparative example 2 relates to a low thermal expansion resin composition comprising polybutadiene and thermosetting polyphenylene ether as cross linking agents. The composition contains the filler in an amount larger than that in comparative example 1. The cure resin exhibited dielectric tangent of 0.0015 and a thermal expansion coefficient in Z direction was 26 ppm/° C. Since the cured resin has low thermal expansion coefficient and low dielectric tangent, it is suitable for insulating material of high frequency electronic devices.

Examples 5-8

Examples 5-8 relate to cured prepregs (hereinafter laminate) using the cloth No. 2 containing 50 wt % of polyolefin fiber and the resin in comparative example 2 as the low thermal expansion coefficient resin. The characteristics are shown in Table 2.

The dielectric tangent of the laminates was 0.0009 to 0.0013, which was smaller than that of the cured resin composition by virtue of the low dielectric tangent of the fiber substrate. It was confirmed that the thermal expansion coefficient in Z direction became smaller as the content of the resin in the prepreg, i.e. polyolefin fiber content decreased.

FIG. 1 shows a relationship between a content of polyolefin fiber in the prepreg and thermal expansion coefficient of the laminates in Z direction. The laminate exhibited excellent solder heat resistance before and after moisture absorption. From these facts, the prepreg and the laminates according to the present invention are excellent in dielectric characteristics, low thermal expansion coefficient and heat resistance, and they are suitable as an insulating material for high frequency electronic devices.

Table 2 shows characteristics of resin compositions used in the comparative example and examples, of the fiber compositions of the fiber substrates and of laminates. In Table 2, a resin composition that provides a cured product having a thermal expansion coefficient of 30 ppm/° C. was used.

Examples 9 to 12

Examples 9 to 12 relate to cured prepregs (hereinafter laminate) using the cloth No. 1 containing 40 wt % of polyolefin fiber and the resin in comparative example 2 as the low thermal expansion coefficient resin. The characteristics are shown in Table 3.

The dielectric tangent of the laminates was 0.0008 to 0.0013, which was smaller than that of the cured resin composition by virtue of the low dielectric tangent of the fiber substrate. It was confirmed that the thermal expansion coefficient in Z direction became smaller as the content of the resin in the prepreg, i.e. polyolefin fiber content decreased.

Figure 2:
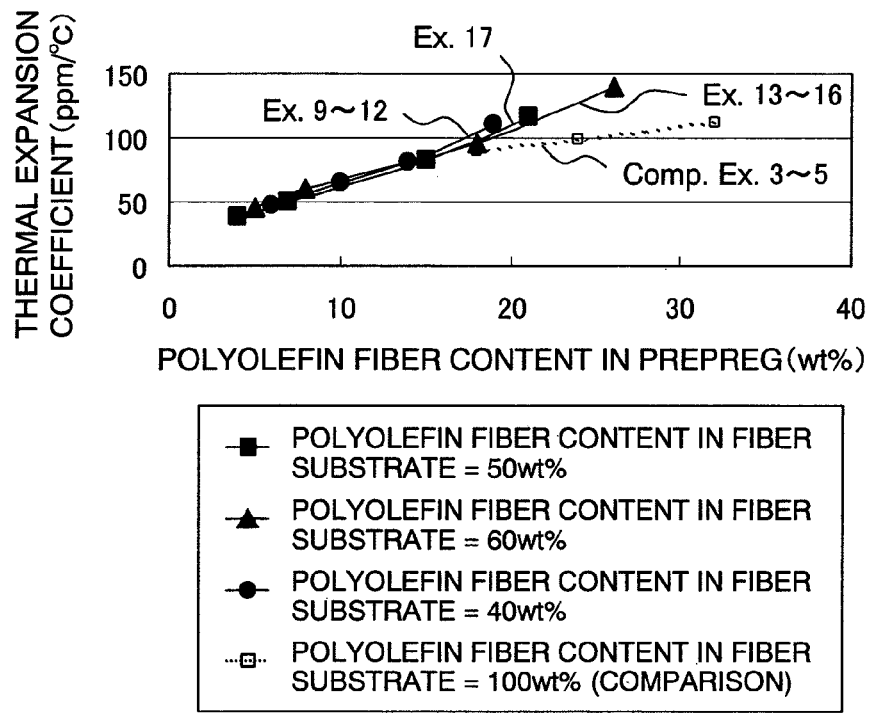
FIG. 2 is a graph showing a relationship between a content of polyolefin fiber in the prepreg and a thermal expansion coefficient in Z-direction of a laminate in examples 9 to 17 and comparative examples 3 to 5.
Figure 3A:
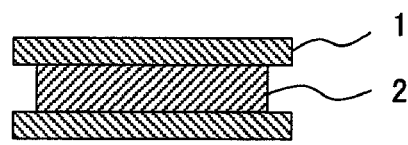
FIG. 3 is a flow chart of a producing an antenna built-in substrate.
Figure 3B:
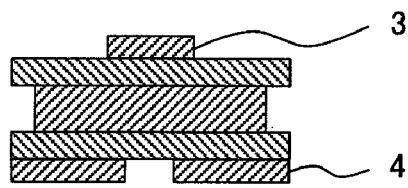
Figure 3C:
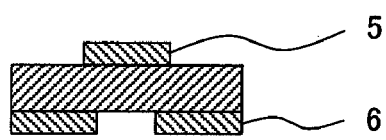
Figure 3D:
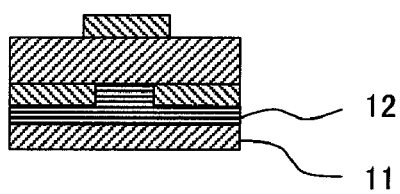
Figure 3E:
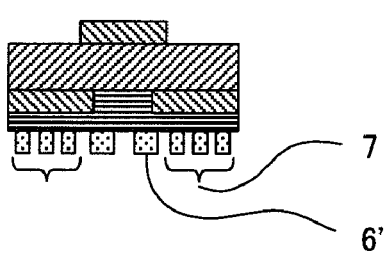
Figure 3F:
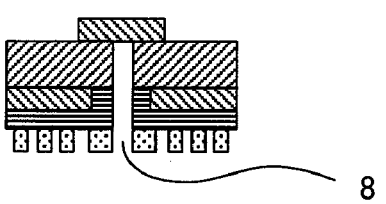
Figure 3G:
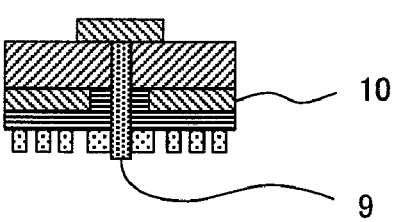

FIG. 2 shows a relationship between a content of polyolefin fiber in the prepreg and thermal expansion coefficient of the laminates in Z direction. The laminate exhibited excellent solder heat resistance before and after moisture absorption. From these facts, the prepreg and the laminates according to the present invention are excellent in dielectric characteristics, low thermal expansion coefficient and heat resistance, and they are suitable as an insulating material for high frequency electronic devices.

Table 3 shows resin compositions, fiber substrate compositions, and characteristics of the laminates using the prepregs. In Table 3, a resin composition that provides a cured product having a thermal expansion coefficient of 40 ppm/° C. was used.

TABLE 2

| Names of materials | Product name | Comp. Ex. 2 | Ex. 5 | Ex. 6 | Ex. 7 | Ex. 8 |
|---|---|---|---|---|---|---|
| Low molecular weight polybutadiene | B3000 | | | 38.5 | | |
| High molecular weight polybutadiene | RB810 | | | 38.5 | | |
| Thermosetting polyphenylene ether | OPE2S t | | | 7.6 | | |
| High molecular polymer (rubber) | H1031 | | | 15.4 | | |
| Fl23Oame retardant | SAYTEX8010 | | | 87 | | |
| Filler | S025R | | | 230 | | |
| Coupling agent | KBM503 | | | 0.1 | | |
| Initiator | Perhexine25B | | | 0.3 | | |
| Fiber substrate | PP/quartz weight ratio | — | | 50/50 | | |
|  | Weight (g/m$^2$) | — | | 73 | | |
| Characteristics of laminate | Resin content (wt %) | 100 | 58 | 70 | 86 | 92 |
|  | PP content in the laminate (wt %) | 0 | 21 | 15 | 7 | 4 |
|  | Dielectric constant at 10 GHz | 2.8 | 2.7 | 2.7 | 2.7 | 2.8 |
|  | Dielectric tangent at 10 GHz | 0.0015 | 0.0009 | 0.001 | 0.0013 | 0.0013 |
|  | al in the Z direction (ppm/° C.) 50-100° C. | 26 | 116 | 83 | 50 | 38 |
|  | solder heat at 260° C. resistance (normal state) | — | Good | Good | Good | Good |
|  | Solder heat resistance at 260° C. before and after humid-absorption | — | Good | Good | Good | Good |

TABLE 3

| Names of materials | Product name | Comp. Ex. 2 | Ex. 9 | Ex. 10 | Ex. 11 | Ex. 12 |
|---|---|---|---|---|---|---|
| Low molecular weight polybutadiene | B3000 | | | 38.5 | | |
| High molecular weight polybutadiene | RB810 | | | 38.5 | | |
| Thermosetting polyphenylene ether | OPE2St | | | 7.6 | | |
| High molecular polymer (rubber) | H1031 | | | 15.4 | | |
| Fl230ame retardant | SAYTEX8010 | | | 87 | | |
| Filler | S025R | | | 230 | | |
| Coupling agent | KBM503 | | | 0.1 | | |
| Initiator | Perhexine25B | | | 0.3 | | |
| Fiber substrate | PP/quartz weight ratio | — | | 40/60 | | |
| | Weight (g/m²) | — | | 78 | | |
| Characteristics of laminate | Resin content (wt %) | 100 | 53 | 65 | 75 | 85 |
| | PP content in the laminate (wt %) | 0 | 19 | 14 | 10 | 6 |
| | Dielectric constant at 10 GHz | 2.8 | 2.7 | 2.7 | 2.7 | 2.8 |
| | Dielectric tangent at 10 GHz | 0.0015 | 0.0008 | 0.0011 | 0.0012 | 0.0013 |
| | al in the Z direction (ppm/° C.) 50-100° C. | 26 | 110 | 81 | 65 | 47 |
| | solder heat at 260° C. resistance (normal state) | — | Good | Good | Good | Good |
| | Solder heat resistance at 260° C. before and after humid-absorption | — | Good | Good | Good | Good |

Examples 13 to 16

Examples 13 to 16 relate to cured prepregs (hereinafter laminate) using the cloth No. 3 containing 60 wt % of polyolefin fiber and the resin in comparative example 2 as the low thermal expansion coefficient resin. The characteristics are shown in Table 4.

The dielectric tangent of the laminates was 0.0009 to 0.0014, which was smaller than that of the cured resin composition by virtue of the low dielectric tangent of the fiber substrate. It was confirmed that the thermal expansion coefficient in Z direction became smaller as the content of the resin in the prepreg, i.e. polyolefin fiber content decreased.

FIG. 2 shows a relationship between a content of polyolefin fiber in the prepreg and thermal expansion coefficient of the laminates in Z direction. The laminate exhibited excellent solder heat resistance before and after moisture absorption. From these facts, the prepreg and the laminates according to the present invention are excellent in dielectric characteristics, low thermal expansion coefficient and heat resistance, and they are suitable as an insulating material for high frequency electronic devices.

Table 4 shows resin compositions, fiber substrate compositions, and characteristics of the laminates using the prepregs. In Table 4, a resin composition that provides a cured product having a thermal expansion coefficient of 60 ppm/° C. was used.

TABLE 4

| Names of materials | Product name | Comp. Ex. 2 | Ex. 9 | Ex. 10 | Ex. 11. | Ex. 12 |
|---|---|---|---|---|---|---|
| Low molecular weight polybutadiene | B3000 | | | 38.5 | | |
| High molecular weight polybutadiene | RB810 | | | 38.5 | | |
| Thermosetting polyphenylene ether | OPE2St | | | 7.6 | | |
| High molecular polymer (rubber) | H1031 | | | 15.4 | | |
| Flame retardant | SAYTEX8010 | | | 87 | | |
| Filler | S025R | | | 230 | | |
| Coupling agent | KBM503 | | | 0.1 | | |
| Initiator | Perhexine25B | | | 0.3 | | |
| Fiber substrate | PP/quartz weight ratio | — | | 60/40 | | |
| | Weight (g/m²) | — | | 64 | | |
| Characteristics of laminate | Resin content (wt %) | 100 | 57 | 70 | 87 | 92 |
| | PP content in the laminate (wt %) | 0 | 26 | 18 | 8 | 5 |
| | Dielectric constant at 10 GHz | 2.8 | 2.7 | 2.7 | 2.7 | 2.8 |
| | Dielectric tangent at 10 GHz | 0.0015 | 0.0009 | 0.001 | 0.0013 | 0.0014 |
| | al in the Z direction (ppm/° C.) 50-100° C. | 26 | 140 | 96 | 60 | 45 |
| | Solder heat resistance at 260° C. (normal state) | — | Good | Good | Good | Good |
| | Solder heat resistance at 260° C. before and after humid-absorption | — | Good | Good | Good | Good |

Comparative example 3 to 5

Comparative examples 3 to 5 relate to a cured product of prepreg (hereinafter referred to as a laminate) using the cloth No. 4 containing 100 wt % of polyolefin fiber and the low thermal expansion resin composition of comparative example 2. The characteristics are shown in Table 5. The cured resin exhibited dielectric tangent of 0.0008 to 0.0013, and a thermal expansion coefficient in Z direction decreases as the resin content in the prepreg i.e. the content of polyolefin resin decreases.

FIG. 2 shows a relationship between a polyolefin fiber content in prepreg and a thermal expansion coefficient in Z direction of the laminates. The solder heat resistance after moisture absorption was poorer than the case where cloths containing glass fiber were used. The thermal expansion coefficient in X-Y directions was as large as 60 to 70 ppm/° C. because the fiber substrate did not contain glass fiber. Table 5 shows resin composition of the comparative examples and compositions of fiber materials of the fiber substrates in the prepregs and characteristics of the laminates. In Table 5, a resin composition that provides a cured product having a thermal expansion coefficient of 60 ppm/° C. was used.

TABLE 5

| Names of materials | Product name | | Comp. Ex. 2 | Comp. Ex. 3 | Comp. Ex. 4 | Comp. Ex. 5 |
|---|---|---|---|---|---|---|
| Low molecular weight polybutadiene | B3000 | | | 38.5 | | |
| High molecular weight polybutadiene | RB810 | | | 38.5 | | |
| Thermosetting polyphenylene ether | OPE2St | | | 7.6 | | |
| High molecular polymer (rubber) | H1031 | | | 15.4 | | |
| Fl230ame retardant | SAYTEX8010 | | | 87 | | |
| Filler | S025R | | | 230 | | |
| Coupling agent | KBM503 | | | 0.1 | | |
| Initiator | Perhexine25B | | | 0.3 | | |
| Fiber substrate | PP/quartz weight ratio | | — | | 100/0 | |
| | Weight (g/m$^2$) | | — | | 48 | |
| Characteristics of laminate | Resin content (wt %) | | 100 | 68 | 76 | 82 |
| | PP content in the laminate (wt %) | | 0 | 32 | 24 | 18 |
| | Dielectric constant at 10 GHz | | 2.8 | 2.7 | 2.7 | 2.7 |
| | Dielectric tangent at 10 GHz | | 0.0015 | 0.0008 | 0.001 | 0.0013 |
| | al in Z direction (ppm/° C.) 50-100° C. | | 26 | 112 | 99 | 90 |
| | Solder heat resistance at 260° C. (normal state) | | — | Good | Good | Good |
| | Solder heat resistance at 260° C. before and after humid-absorption | | — | Deformed | Deformed | Deformed |

Comparative Example 6

Comparative example 6 relates to a low thermal expansion coefficient resin composition containing polyfunctional styrene compound and thermosetting polyphenylene ether as cross linking agents, which is superior in dielectric characteristics to the resin compositions of comparative examples 1 and 2. Table shows thermal expansion coefficient (a1) and dielectric characteristics of the cured resin. The dielectric tangent of the cured product was 0.0012 and a thermal expansion coefficient in Z direction was 25 ppm/° C., which are suitable as insulating material for high frequency electronic devices.

Example 17

Example 17 relates to cured prepregs (hereinafter laminate) using the cloth No. 2 and the resin in comparative example 6. The characteristics are shown in Table 6.

The dielectric tangent of the laminates was 0.0009, which was smaller than that of the cured resin composition by virtue of the low dielectric tangent of the fiber substrate. It was confirmed that the thermal expansion coefficient in Z direction was as low as 50 ppm/° C. The laminate according to this example was excellent in solder heat resistance before and after moisture absorption. From the above facts, the prepreg and the laminates according to the present invention are excellent in dielectric characteristics, low thermal expansion coefficient and heat resistance, and they are suitable as an insulating material for high frequency electronic devices.

Table 6 shows compositions of resin compositions of the comparative example and example and compositions of fiber substrates and characteristics of laminates using the prepregs. In Table 6, BVPE resin was used.

Comparative Example 7

Comparative example 7 relates to a low thermal expansion coefficient resin composition containing bismaleimide compound and thermosetting polyphenylene ether as cross linking agents. Table 7 shows thermal expansion coefficient (a1) and dielectric characteristics of the cured resin. The dielectric tangent of the cured product was 0.0018 and a thermal expansion coefficient in Z direction was 24 ppm/° C., which are suitable as insulating material for high frequency electronic devices.

Table 7 shows compositions of resin compositions of the comparative example and example and compositions of fiber substrates and characteristics of laminates using the prepregs.

Example 18

Example 18 relates to cured prepreg comprising the cloth No. 2 containing 50 wt % of polyolefin fiber and a low thermal expansion coefficient resin composition containing the resin composition of comparative example 7 as the low thermal expansion coefficient resin composition. Table 7 shows thermal expansion coefficient (a1) and dielectric characteristics of the cured resin. The dielectric tangent of the laminates was 0.0013, which was smaller than that of the cured resin composition. A thermal expansion coefficient in Z direction was as low as 49 ppm/° C. The laminates of the example are excellent in solder heat resistance before and after moisture absorption. From the above facts, the prepregs and laminates of this example were excellent in dielectric characteristics, low thermal expansion coefficient and heat resistance, and therefore, they are suitable as insulating material for high frequency electronic devices. In Table 7, Bismaleimide resin was used.

TABLE 6

| Names of materials | Product name | Comp. Ex. 6 | Example 17 |
|---|---|---|---|
| Polyfunctional styrene | BVPE | 20 | |
| Thermosetting polyophenylene ether | OPE2s t | 47 | |
| High molecular weigh polymer (rubber) | H1051 | 33 | |
| Flame retardant | SAYTEX8010 | 33 | |
| Filler | SO25R | 230 | |
| Coupling agent | KBM503 | 0.1 | |
| Polymerization inhibitor | tBHQ | 0.05 | |
| Fiber substrate | PP/quartz weight ratio | — | 50/50 |
| | Weight (g/m$^2$) | — | 73 |
| Characteristics of laminates | Resin content | 100 | 80 |
| | PP content in laminate (wt %) | 0 | 10 |
| | Dielectric constant at 10 GHz | 2.8 | 2.7 |
| | Dielectric tangent at 10 GHz | 0.0012 | 0.0009 |
| | a1 in Z direction | 25 | 50 |
| | Solder heat resistance at 260° C. (normal state) | — | Good |
| | Solder heat resistance at 260° C. after humid-absorption | — | Good |

TABLE 7

| Names of materials | Product name | Comp. Ex. 7 | Example 18 |
|---|---|---|---|
| Polyfunctional styrene | BMI5100 | | 20 |
| Thermosetting polyophenylene ether | OPE2st | | 47 |
| High molecular weigh polymer (rubber) | H1051 | | 33 |
| Flame retardant | SAYTEX8010 | | 33 |
| Filler | SO25R | | 230 |
| Coupling agent | KBM503 | | 0.1 |
| Polymerization initiator | Perhexine25B | | 0.1 |
| Polymerization inhibitor | TBHQ | | 0.05 |
| Fiber substrate | PP/quartz weight ratio | — | 50/50 |
| | Weight (g/m²) | — | 73 |
| Characteristics of laminates | Resin content | 100 | 80 |
| | PP content in laminate (wt %) | 0 | 10 |
| | Dielectric constant at 10 GHz | 2.8 | 2.7 |
| | Dielectric tangent at 10 GHz | 0.0018 | 0.0013 |
| | al in Z direction | 24 | 49 |
| | Solder heat resistance at 260° C. | — | Good |
| | Solder heat resistance at 260° C. after humid-absorption | — | Good |

Example 19

In Example 19 an antenna circuit built-in high frequency substrate was prepared using the prepreg in example 17. The flow chart is shown in FIG. 3.

(A) The prepreg 2 in example 17 was cut into 100 mm×100 mm pieces, and ten pieces were stacked. The stack was sandwiched between copper foils. The stack was pressed and heated with a vacuum press under 2 MPa at an elevating rate of 6° C./min. to 230° C. at which the stack was held for 1 hour to produce a copper clad laminate.

(B) A photoresist HS425 (manufactured by Hitachi Chemical Co., Ltd.) was laminated on one face of the copper clad laminate. A mask for forming through holes for connecting an antenna circuit was applied and subjected to light exposure. A photoresist HS425 was laminated of the other face of the copper clad laminate to expose an antenna test pattern 3. The non-exposed photoresists on both faces were developed with a 1% sodium carbonate solution to thereby obtain a photoresist through hole pattern 4.

(C) Copper foils exposed by etching with an etching solution containing 5% of sulfuric acid and 5% of hydrogen peroxide was removed by etching to form antenna pattern 3 and through hole pattern 6 on both faces thereof. Remaining photoresist was removed with a 3% sodium hydroxide solution.

(D) Copper foil 11 was laminated on the though hole pattern 6 side of the copper clad laminate by means of a sheet of prepreg 12, and they were pressed and heated in the same manner as in (A) to produce a multilayered laminate.

(E) Circuit 7 and through hole pattern 6' were formed in the copper foil layer 11 in the same manners as in (B) and (C).

(F) As a mask, the through hole pattern 6' was used to form a through hole 8 with a carbon dioxide gas laser.

(G) Silver paste 9 was filled in the through hole 8 to connect the antenna circuit and wiring on the rear side to thereby prepare the antenna built-in printed circuit board having a shield layer beneath the antenna circuit.

What is claimed is:

1. A prepreg comprising composite woven cloth composed of mixed spun fiber of quartz glass fiber and polyolefin fiber that are a main part of the cloth and a thermosetting resin composition that gives a cured product having a low thermal expansion coefficient, wherein the thermal expansion coefficient of the cured resin composition at 50 to 100° C. is 50 ppm/° C. or less, wherein the thermosetting resin composition comprises:
(i) a curable polyphenylene ether compound;
(ii) one member selected from the group consisting of polybutadiene compounds represented by Formula 1, polyfunctional styrene compounds represented by Formula 2, and bismaleimide compounds represented by Formula 3,

Formula 1

(In the formula 1, n is an integer of 10 or more, and a weight average molecular weight based on polystyrene conversion in GPC (Gel Permeation Chromatography) is 1000 or more);

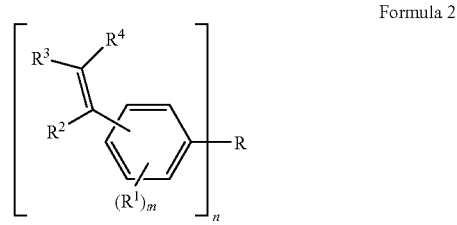

Formula 2

(In the Formula 2, R denotes hydrogen skeleton, $R^1$ is hydrogen or a hydrocarbon group having a carbon number of 1 to 20, the $R^1$ being the same or different, $R^2$, $R^3$ and $R^4$ are hydrogen or hydrocarbon group having a carbon number of 1 to 6, the $R^2$, $R^3$ and $R^4$ being the same or different); and Formula 3

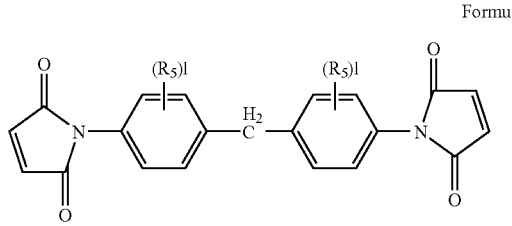

In the Formula 3, $R_5$ represents a hydrocarbon group having a carbon number of 1 to 4, the $R_5$ being the same or different and l is an integer of 1 to 4);
(iii) silicon oxide filler;
(iv) a silane coupling agent; and
(v) a hydrogenated styrene-butadiene copolymer.

2. The prepreg according to claim 1, wherein the composite woven cloth is composed of 40 to 60 weight % of quartz glass fiber and 60 weight % to 40 weight % of polyolefin fiber, and a content of the thermosetting resin with the low thermal expansion coefficient is 45 to 98 wt % based on the weight of the prepreg.

3. The prepreg according to claim 1, wherein a content of the polyolefin fiber is 1 to 18 wt % based on the weight of the prepreg.

4. The prepreg according to claim 1, wherein a dielectric tangent of the cured product of the thermosetting resin composition is 0.005 or less at 1 GHZ.

5. The prepreg according to claim 1, wherein the thermosetting resin composition contains at least one of a flame retardant agent represented by Formula 4 and formula 5, a radical polymerization initiator and a radical polymerization inhibitor:

Formula 4

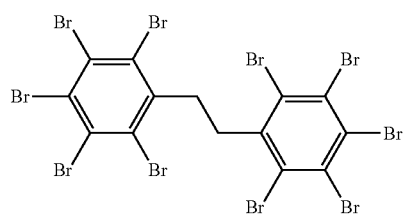

Formula 5

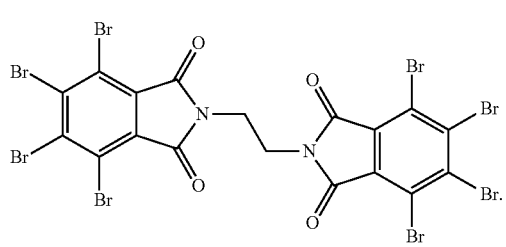

6. A laminate having a conductive layer formed on one face or both faces of the cured prepreg defined in claim 1.

7. An electronic part having a circuit for sending electric signals of a frequency of 1 GHz or more, wherein an insulator of the electronic part is a cured product of the prepreg according to claim 1.

8. A printed circuit board wherein the conductive layer of the laminate defined in claim 6 has been worked into a wiring pattern.

9. The printed circuit board according to claim 8, wherein the printed circuit board is provided with an antenna circuit.

10. A multi-layered printed circuit board, wherein the printed circuit board as defined in claim 8 is laminated with a conductor layer or another printed circuit board by means of a prepreg.

11. A prepreg comprising a cloth and a semi-cured thermosetting resin composition of a thermosetting resin composition, wherein a main part of the cloth is a composite woven cloth obtained from mixed spun fiber of quartz glass fiber and polyolefin fiber and the semi-cured thermosetting resin composition gives a cured resin having a thermal expansion coefficient of 50 ppm/° C. at 50 to 100° C.,
wherein the thermosetting resin composition comprises:
(i) a curable polyphenylene ether compound;
(ii) one member selected from the group consisting of polybutadiene compounds represented by Formula 1, polyfunctional styrene compounds represented by Formula 2, and bismaleimide compounds represented by Formula 3, Formula 1

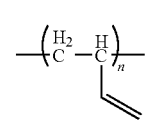

(In the formula 1, n is an integer of 10 or more, and a weight average molecular weight based on polystyrene conversion in GPC (Gel Permeation Chromatography) is 1000 or more);

Formula 2

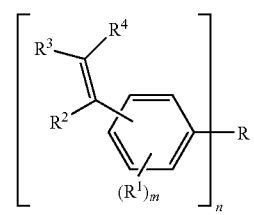

(In the Formula 2, R denotes hydrogen skeleton, $R^1$ is hydrogen or a hydrocarbon group having a carbon number of 1 to 20, the $R^1$ being the same or different, $R^2$, $R^3$ and $R^4$ are hydrogen or hydrocarbon group having a carbon number of 1 to 6, the $R^2$, $R^3$ and $R^4$ being the same or different); and Formula 3

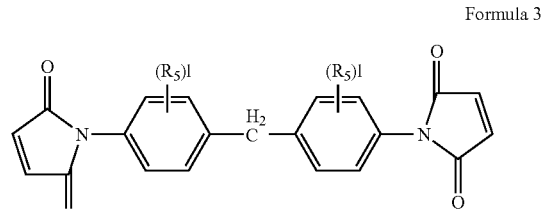

In the Formula 3, $R_5$ represents a hydrocarbon group having a carbon number of 1 to 4, the $R_5$ being the same or different and l is an integer of 1 to 4.);
(iii) silicon oxide filler;
(iv) a silane coupling agent; and
(v) a hydrogenated styrene-butadiene copolymer.

12. A laminate having a conductive layer formed on one face or both faces of a prepreg, which comprises a composite woven cloth obtained from mixed spun fiber of quartz glass fiber and polyolefin fiber and a cured thermosetting resin composition having a thermal expansion coefficient of 50 ppm/° C. at 50 to 100° C., the cured thermosetting resin composition having been formed from a thermosetting resin composition, wherein the thermosetting resin composition comprises:
(i) a curable polyphenylene ether compound;
(ii) one member selected from the group consisting of polybutadiene compounds represented by Formula 1, polyfunctional styrene compounds represented by Formula 2, and bismaleimide compounds represented by Formula 3,

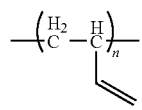

Formula 1

(In the formula 1, n is an integer of 10 or more, and a weight average molecular weight based on polystyrene conversion in GPC (Gel Permeation Chromatography) is 1000 or more);

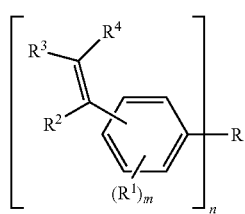

Formula 2

(In the Formula 2, R denotes hydrogen skeleton, $R^1$ is hydrogen or a hydrocarbon group having a carbon number of 1 to 20, the $R^1$ being the same or different, $R^2$, $R^3$ and $R^4$ are hydrogen or hydrocarbon group having a carbon number of 1 to 6, the $R^2$, $R^3$ and $R^4$ being the same or different); and

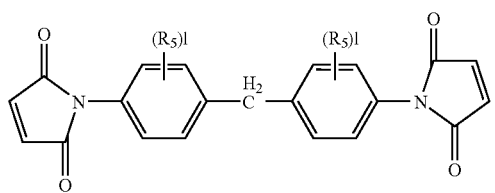

Formula 3

In the Formula 3, $R_5$ represents a hydrocarbon group having a carbon number of 1 to 4, the $R_5$ being the same or different and I is an integer of 1 to 4.);
(iii) silicon oxide filler;
(iv) a silane coupling agent; and
(v) a hydrogenated styrene-butadiene copolymer.

13. A printed circuit board comprising at least one of a laminate having a wiring pattern on one surface or both surfaces of one or more of the laminates, which comprises a composite woven cloth obtained from mixed spun fiber of quartz glass fiber and polyolefin fiber and a cured thermosetting resin composition having a thermal expansion coefficient of 50 ppm/° C. at 50 to 100° C., the cured thermosetting resin composition having been formed from a thermosetting resin composition, wherein the thermosetting resin composition comprises:
(i) a curable polyphenylene ether compound;
(ii) one member selected from the group consisting of polybutadiene compounds represented by Formula 1, polyfunctional styrene compounds represented by Formula 2, and bismaleimide compounds represented by Formula 3,

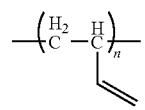

Formula 1

(In the formula 1, n is an integer of 10 or more, and a weight average molecular weight based on polystyrene conversion in GPC (Gel Permeation Chromatography) is 1000 or more);

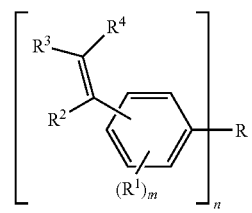

Formula 2

(In the Formula 2, R denotes hydrogen skeleton, $R^1$ is hydrogen or a hydrocarbon group having a carbon number of 1 to 20, the $R^1$ being the same or different, $R^2$, $R^3$ and $R^4$ are hydrogen or hydrocarbon group having a carbon number of 1 to 6, the $R^2$, $R^3$ and $R^4$ being the same or different); and

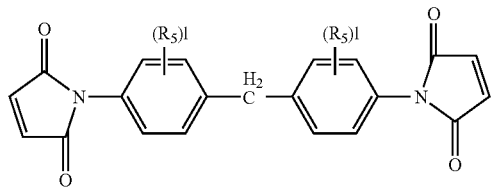

Formula 3

In the Formula 3, $R_5$ represents a hydrocarbon group having a carbon number of 1 to 4, the $R_5$ being the same or different and I is an integer of 1 to 4. );
(iii) silicon oxide filler;
(iv) a silane coupling agent; and
(v) a hydrogenated styrene-butadiene copolymer.

14. A multi-layered printed circuit board comprising a plurality of printed circuit boards each comprising a wiring pattern formed on one face or both faces of cured prepregs, each of the prepregs comprising a composite woven cloth obtained from mixed spun fiber of quartz glass fiber and polyolefin fiber and a cured thermosetting resin composition having a thermal expansion coefficient of 50 ppm/° C. at 50 to 100° C., the cured thermosetting resin composition having been formed from a thermosetting resin composition,
wherein the thermosetting resin composition comprises:
(i) a curable polyphenylene ether compound;
(ii) one member selected from the group consisting of polybutadiene compounds represented by Formula 1, polyfunctional styrene compounds represented by Formula 2, and bismaleimide compounds represented by Formula 3, Formula 1

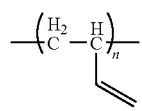

(In the formula 1, n is an integer of 10 or more, and a weight average molecular weight based on polystyrene conversion in GPC (Gel Permeation Chromatography) is 1000 or more);

Formula 2

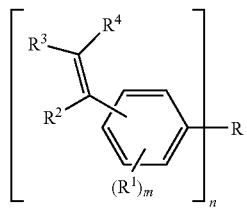

(In the Formula 2, R denotes hydrogen skeleton, $R^1$ is hydrogen or a hydrocarbon group having a carbon number of 1 to 20, the $R^1$ being the same or different, $R^2$, $R^3$ and $R^4$ are hydrogen or hydrocarbon group having a carbon number of 1 to 6, the $R^2$, $R^3$ and $R^4$ being the same or different); and Formula 3

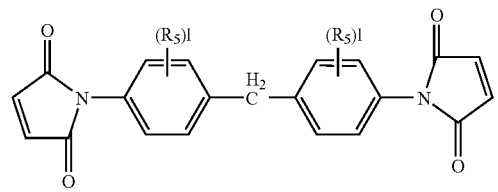

In the Formula 3, $R_5$ represents a hydrocarbon group having a carbon number of 1 to 4, the $R_5$ being the same or different and I is an integer of 1 to 4.);

(iii) silicon oxide filler;
(iv) a silane coupling agent; and
(v) a hydrogenated styrene-butadiene copolymer.

* * * * *